United States Patent [19]

Billman et al.

[11] Patent Number: 4,919,623

[45] Date of Patent: Apr. 24, 1990

[54] BURN-IN SOCKET FOR INTEGRATED CIRCUIT DEVICE

[75] Inventors: Timothy B. Billman, King; Joseph R. Goodman, Walkertown, both of N.C.

[73] Assignee: AMP Incorporated, Harrisburg, Pa.

[21] Appl. No.: 310,254

[22] Filed: Feb. 13, 1989

[51] Int. Cl.⁵ .............................................. H01R 9/09
[52] U.S. Cl. ..................... 439/70; 439/266; 439/331
[58] Field of Search ............... 439/264, 266, 268, 330, 439/331, 68, 70, 71, 72, 73, 259, 260, 263, 267, 269

[56] References Cited

U.S. PATENT DOCUMENTS

| | | | |
|---|---|---|---|
| 2,992,401 | 7/1961 | Lewis | 339/22 |
| 3,683,317 | 8/1972 | Walkup | 339/75 MP |
| 3,753,211 | 8/1973 | Pauza et al. | 339/75 MP |
| 3,820,054 | 6/1974 | Clewes et al. | 339/17 CF |
| 3,848,221 | 11/1974 | Lee, Jr. | 339/74 R |
| 3,883,207 | 5/1975 | Tomkiewicz | 339/75 M |
| 4,052,117 | 10/1977 | Tengler et al. | 339/17 CF |
| 4,080,032 | 3/1978 | Cherian et al. | 339/75 M |
| 4,159,861 | 7/1979 | Anhalt | 339/75 MP |
| 4,266,840 | 5/1981 | Seidler | 339/75 M |
| 4,312,555 | 1/1982 | Donaher et al. | 339/75 MP |
| 4,331,371 | 5/1982 | Ichimura et al. | 339/74 R |
| 4,343,524 | 8/1982 | Bright et al. | 339/74 R |
| 4,349,238 | 9/1982 | Showman et al. | 339/75 M |
| 4,350,402 | 9/1982 | Douty et al. | 339/74 R |
| 4,381,130 | 4/1983 | Sprenkle | 339/74 R |
| 4,391,408 | 7/1983 | Hanlon et al. | 339/75 M |
| 4,422,703 | 12/1983 | Christensen et al. | 339/74 R |
| 4,461,525 | 7/1984 | Griffin | 339/75 M |
| 4,470,650 | 9/1984 | Lundergan | 339/17 CF |
| 4,491,377 | 1/1985 | Pfaff | 339/74 R |
| 4,492,047 | 2/1985 | Hexamer et al. | 324/158 F |
| 4,509,812 | 4/1985 | Lotter | 339/75 M |
| 4,533,192 | 8/1985 | Kelley | 339/45 M |
| 4,547,031 | 10/1985 | Korsunsky | 439/73 |
| 4,630,875 | 12/1986 | Korsunsky et al. | 339/17 CF |
| 4,645,279 | 2/1987 | Grabbe et al. | 339/17 CF |
| 4,669,796 | 6/1987 | Carter | 439/267 |
| 4,678,255 | 7/1987 | Carter | 439/267 |
| 4,691,975 | 9/1987 | Fukunaga et al. | 439/266 |
| 4,715,823 | 12/1987 | Ezura et al. | 439/267 |
| 4,718,855 | 1/1988 | Billman et al. | 439/90 |
| 4,746,299 | 5/1988 | Matsuoka et al. | 439/70 |
| 4,750,890 | 6/1988 | Dube et al. | 439/152 |
| 4,799,897 | 1/1989 | Magi et al. | 439/264 |
| 4,808,119 | 2/1989 | Pfaff | 439/268 |
| 4,824,389 | 4/1989 | Doyle et al. | 439/269 |

FOREIGN PATENT DOCUMENTS 1427157 7/1987 Japan .
1152765 5/1969 United Kingdom .

OTHER PUBLICATIONS

Jedec Solid State Products Engineering Counsel Committee Letter Ballot JC-11.11-87-82, Item 11-234.
Brochure entitled, "Chip Carrier Sockets for Automated Burn-In".
Brochure, "Burn-In Sockets for Surface Mount Devices, Locknest the Simple Alternative . . . at Any Size".
Brochure, "Ideas for SMD Burn-In Automation".
Article, "SMD Burn-In Board Standardization for Automation", appearing in Evaluation Engineering, May 1986.

Primary Examiner—Neil Abrams
Assistant Examiner—Khiem Nguyen
Attorney, Agent, or Firm—Robert W. Pitts

[57] ABSTRACT

A burn-in socket adapted for use with plastic quad flat pack packages having gullwing leads is disclosed. The socket comprises an insulative housing base and a reciprocal cap frame located on top of the insulative housing. A plurality of resilient contact terminals are positioned along the sides of the insulative housing around the periphery of a cavity for receiving the PQFP package. Each contact terminal is inwardly deflectable upon movement of the cap so that gullwing leads of the PQFP package will be received between the contact terminal and an inwardly facing ledge. The socket is suitable for use with automatic loading equipment.

24 Claims, 7 Drawing Sheets

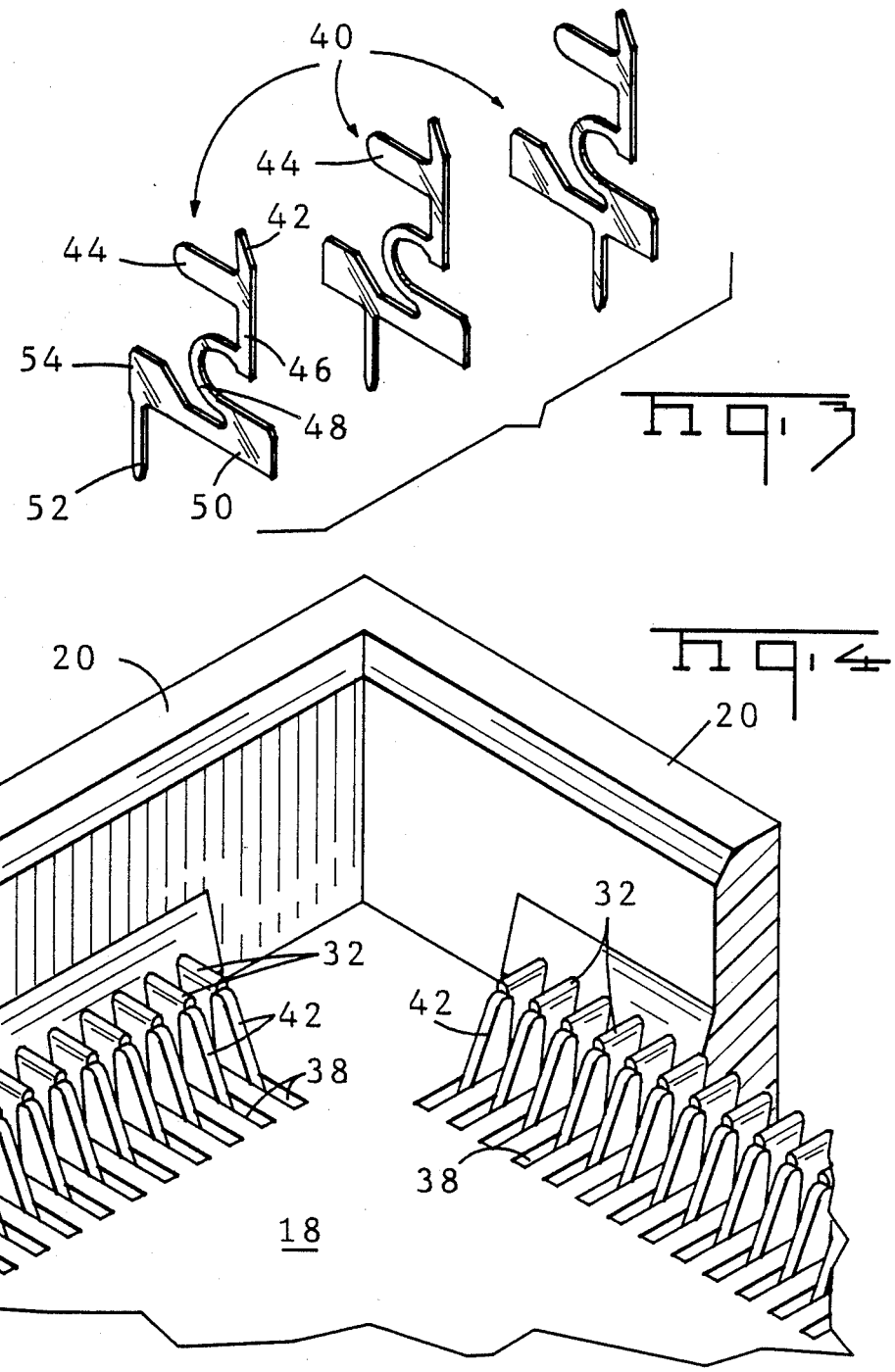

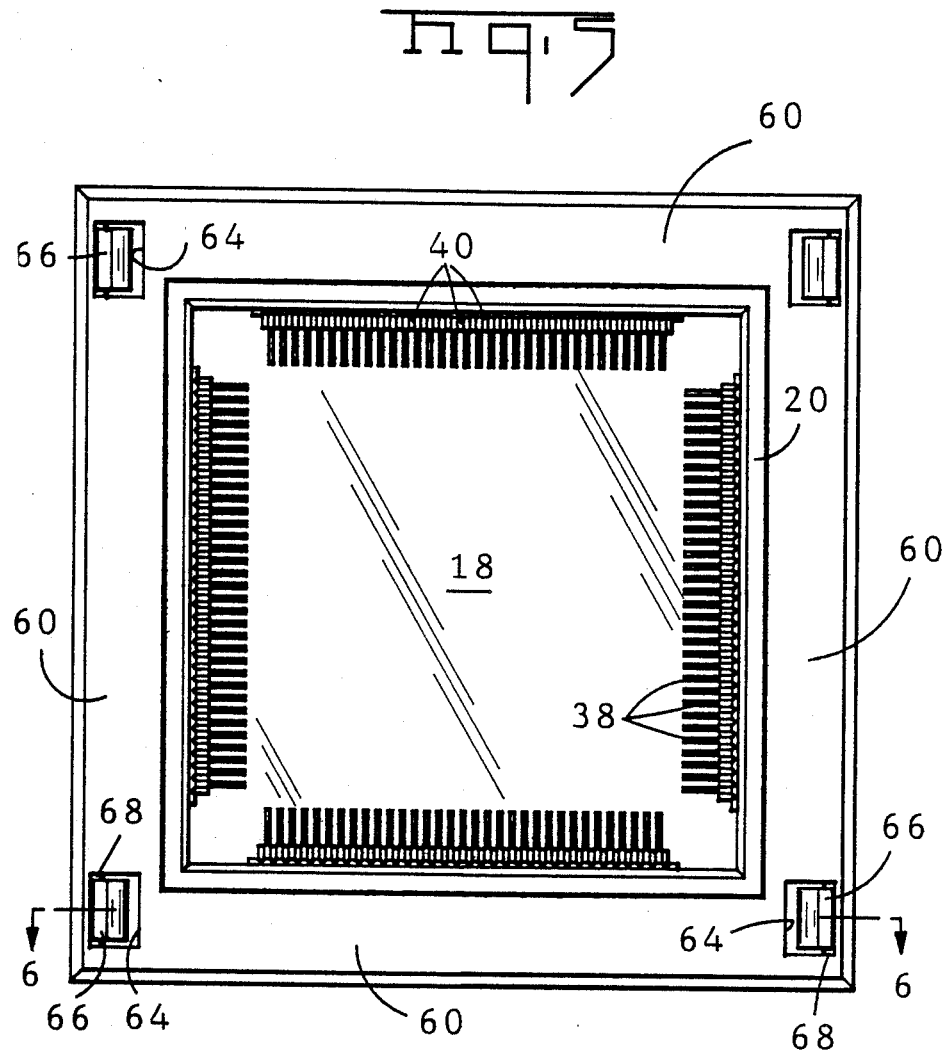

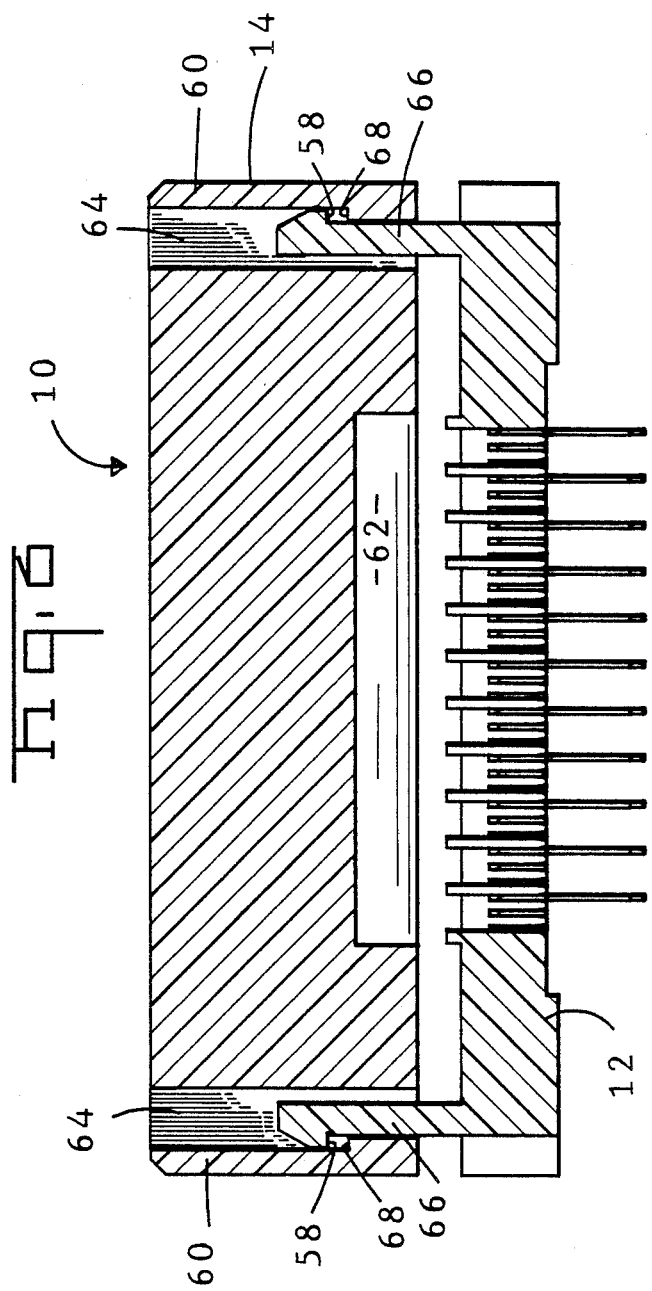

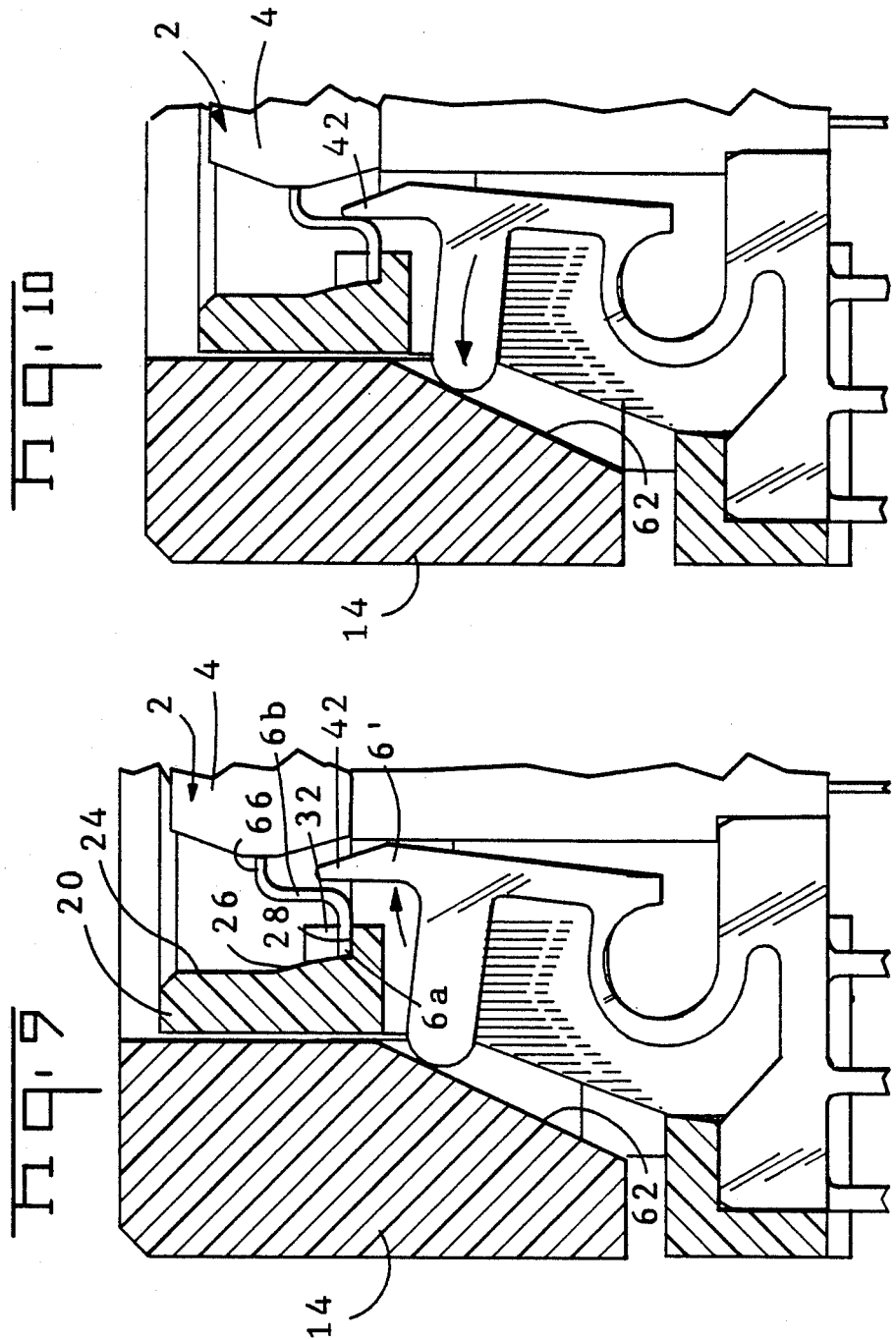

BURN-IN SOCKET FOR INTEGRATED CIRCUIT DEVICE

BACKGROUND OF THE INVENTION

1. Field of the Invention

This invention relates to a socket for use with integrated circuit components and more particularly to a burn-in socket for use in testing gullwing leaded integrated circuit components.

2. Description of the Prior Art

In order to insure the reliability of integrated circuit components, it has long been necessary to subject these components to accelerated heat-age testing. This so called burn-in testing is sometimes conducted for all components and in other cases is conducted on a statistical basis to insure that the components in questions will perform satisfactorily.

Burn-in sockets have been employed to test integrated circuit devices such as IC chips. A plurality of burn-in sockets can be disposed on a printed circuit board which is then positioned within a burn-in oven to subject the integrated circuit chips or chip packages to heat-age testing. Burn in sockets have been developed for use with leadless ceramic chip carriers, with through hole leaded dual-in-line packages (DIP's) and for leaded surface mount components.

One such burn-in socket for use in testing leadless chip carriers, is disclosed in U.S. Pat. No. 4,491,377. That socket includes an insulating base support containing a plurality of electrically conductive pins extending through the insulating base. A spreader is mounted for reciprocal movement relative to the pins. The spreader has an inclined surface engaging edges of the pins so that movement of the spreader toward the insulating base shifts the pins outwardly. A leadless chip carrier can then be inserted into a cavity surrounded by the pins. The pins can thus make contact with terminal lands within grooves on the edge of the leadless chip carriers.

The zero insertion force socket disclosed in U.S. Pat. No. 4,491,377 provides certain advantages when used with automatic loading equipment. Actuation of the spreader in that socket can be accomplished by straight line motion in the same direction in which a leadless chip carrier would be loaded into the socket. Individual chip carriers can be positioned in an insertion head. The insertion head would be brought into contact with the spreader on the socket, which would shift the terminal pins to allow room for insertion of a chip carrier, held on the insertion head. Extraction of a leadless chip carrier could be accomplished in the same way. When the socket shown in U.S. Pat. No. 4,491,377 is employed with plastic leadless chip carriers or leadless chip carriers, these chip carriers must be located upside-down or in the "dead bug" configuration.

The advent of new integrated circuit packages has however, lead to additional complications for burn-in testing and for sockets used for burn-in testing. The plastic quad flat pack package (PQFP) has gullwing leads located on four sides of a rectangular or square plastic body. Standard versions of these low profile plastic quad flat packages have gullwing leads on 0.025 inch center line spacings. These gullwing leads extend from all four sides of the body of the PQFP device. The lower portions of the gullwing leads have outwardly extending feet which extend below the lower surface of the body of the PQFP. Typically, these feet are slightly inclined relative to the horizontal, for example, from 0 degrees to 8 degrees. In use, a PQFP could be soldered to surface mount pads on a printed circuit board. These leads are generally plated in a conventional manner to promote a reliable solder joint. It is important that the lower surface of these plated leads not be damaged during burn-in testing. These gullwing leads are relatively small and fragile and care must be taken not to overstress or damage the leads during burn-in testing. Sockets of the type shown in U.S. Pat. No. 4,491,377 are not suitable for use with PQFP or quad pack components. It is possible to separately attach an adaptor to the plastic quad flat packages so that the adaptor supports the leads. The PQFP packages mounted in an adaptor of that type can then be inserted into a socket such as that shown in U.S. Pat. No. 4,491,377.

However, the efficiencies otherwise obtained by using a socket of the type shown in U.S. Pat. No. 4,491,377 in conjunction with automatic loading equipment would be reduced or eliminated if it is necessary to first mount the plastic quad flat packages in an adaptor. The present invention, however, comprises a socket suitable for use with gullwing packages, such as PQFP's, without requiring an additional adaptor.

SUMMARY OF THE INVENTION

The socket depicted herein is for use in establishing an electrical interconnection to an electrical component such as a plastic quad flat pack package having gullwing leads. The socket has a plurality of contact terminals extending upwardly from an insulative housing. A cap or spreader shiftable relative to the insulative housing engages the contact terminals to urge each terminal inwardly. A gullwing component is loaded into the socket with the leads projecting downwardly, in the "live bug" configuration. An upward projection on each contact terminal extends between the corresponding gullwing lead and the body of the PQFP package. Each contact terminal is outwardly resiliently flexible so that the upward projection contacts the inner surface of each gullwing lead. The contact terminals make contact along the inner surface of the gullwing leads rather than contacting the lower surfaces of the feet of the gullwing leads. Damage to the feet of the gullwing leads, where the lead would be soldered to a surface mount printed circuit board pad, can thus be avoided. The insulative housing also has an inwardly facing ledge. This inwardly facing ledge is positioned to abut the free end of each gullwing lead extending along a corresponding ledge. The ledge thus acts as a stop to prevent damage to the PQFP gullwing leads when the leads are subjected to an outward force by the resilient contact terminals. This socket is therefore suitable for use with automatic loading equipment and does not require any additional steps, such as the addition of an adaptor.

BRIEF DESCRIPTION OF THE DRAWINGS

FIG. 1 is a section view of the PQFP socket.

FIG. 3 is a perspective view of contact terminals suitable for use in this socket.

FIG. 4 is a perspective view, partially in section, showing the projections of the contact terminals and the outer ledge of the insulative housing.

FIG. 5 is a plan view of the PQFP socket comprising the preferred embodiment of this invention.

FIG. 6 is a sectional view of taken along section line 6—6 in FIG. 5 and showing the manner in which the cap is secured to the insulative base.

FIGS. 7–10 are sectional views depicting the insertion of a plastic quad flat pack package into a socket and the engagement of a gullwing contact lead by a contact terminal.

DETAILED DESCRIPTION OF THE PREFERRED EMBODIMENT

Figure 1:
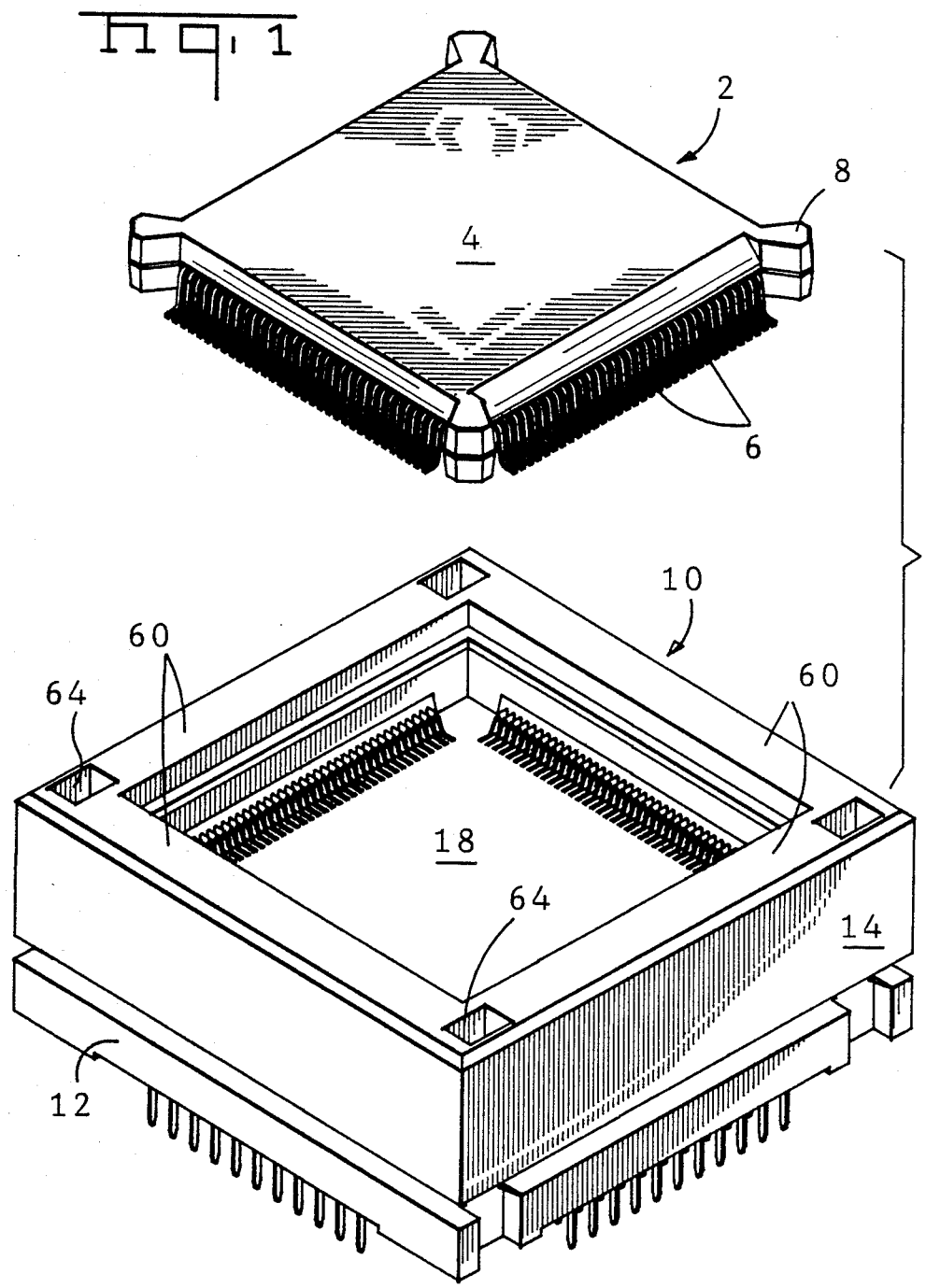
FIG. 1 is an exploded view showing a plastic quad flat pack package positioned above a socket comprising the preferred embodiment of the invention.
Figure 2:
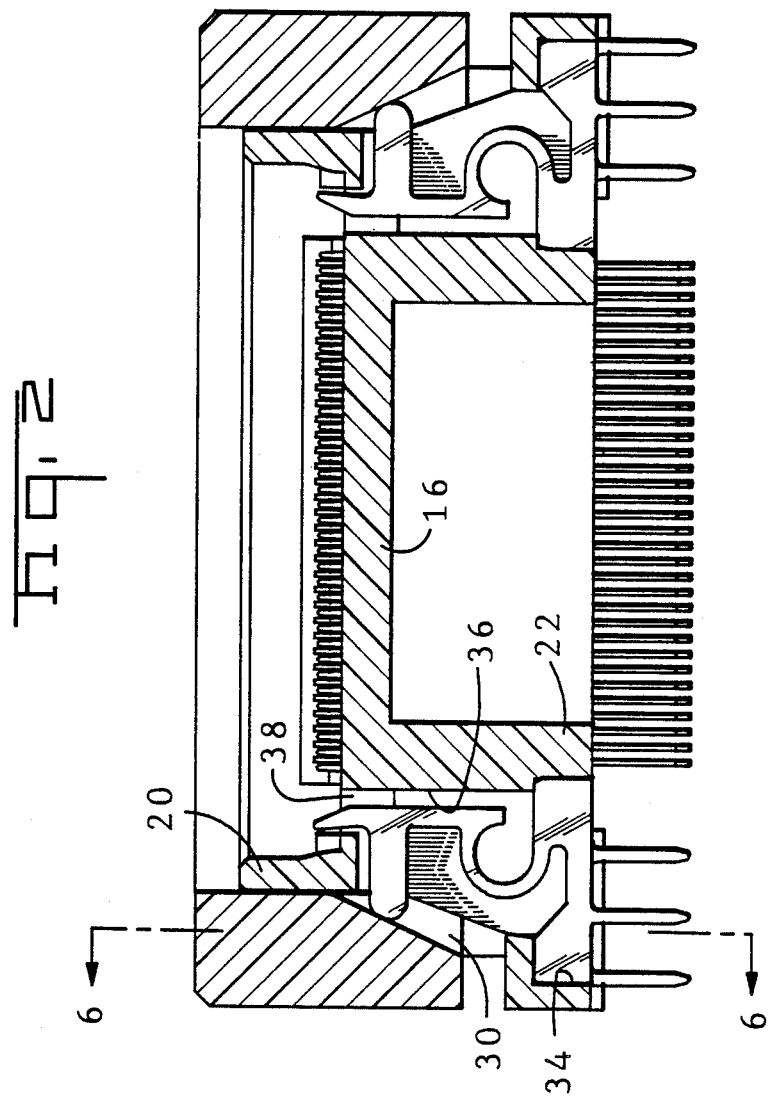
Figure 18:
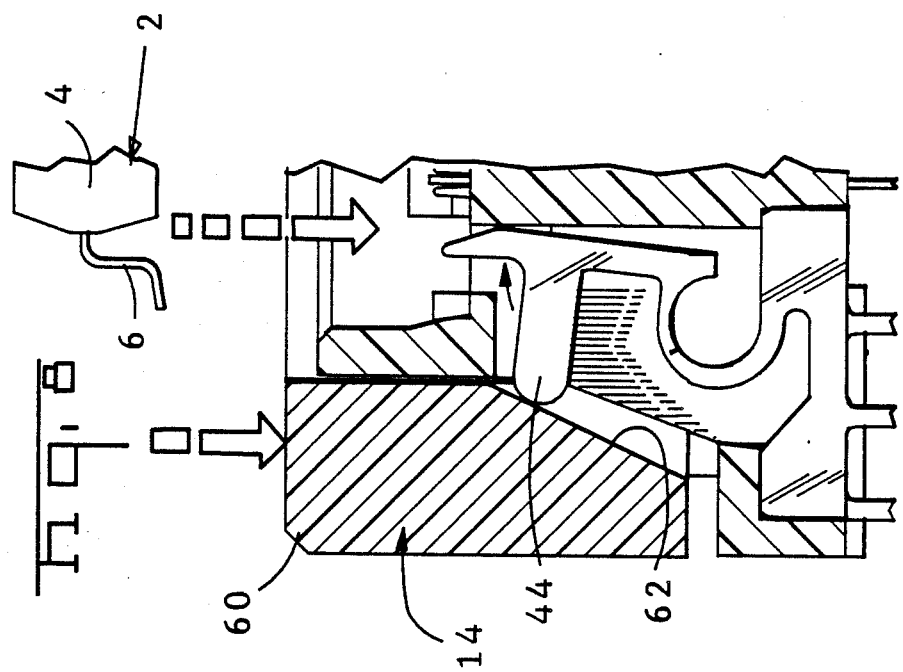
Figure 17:
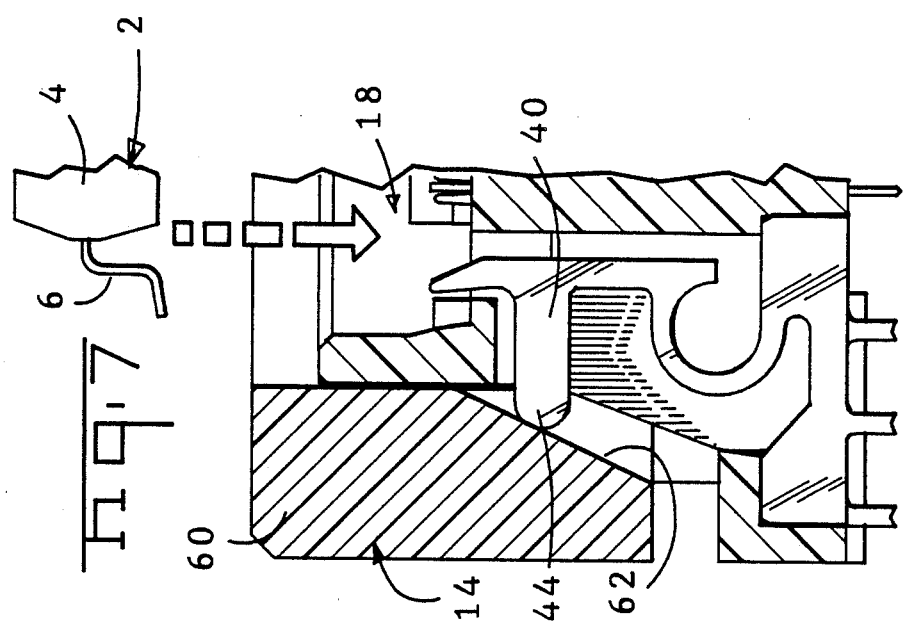

FIG. 1 shows a plastic quad flat package 2 which is representative of an integrated circuit package or a leaded electronic component. The plastic quad flat pack package 2 (PQFP) represents a conventional integrated circuit package in which the integrated circuit component is mounted within a plastic body 4 with gullwing lead 6 extending outwardly from each of the four sides of the body 4. Corner extensions 8 are located at each corner of the body 4 of the conventional PQFP package 2. These corners 8 are located between gullwing contact leads 6 located in rows on adjacent sides of the package 2.

The socket 10 comprising the preferred embodiment of this invention is specifically adapted for use with a standard PQFP package 2. Socket 10 includes a socket housing 12 and a cap spreader 14. The socket housing 12 and the cap 14 are each fabricated of conventional plastic material capable of withstanding the temperatures encountered in a burn-in testing oven. The insulative housing 12 has a centrally located socket base 16 with a plurality of ledges 20 extending upwardly from the socket base 16 to define a generally rectangular cavity 18 between the ledges 20 and the socket base 16. Each of the ledges 20 has an inwardly facing surface located along the periphery of the cavity 18 spaced outwardly from the upward surface of the socket base 16. In the preferred embodiment of this invention this inwardly facing surface has a vertical portion 24 adjacent its upper end with a slightly inclined interface 26 extending from the vertical face portion 24 to a lower face 28 located substantially in the plane of the top of base 16. Walls 22 extend downwardly from base 16 and a plurality of pockets 30 are defined along the exterior of the depending walls 22. Each pocket 30 has an opening 38 located between the lower face 28 adjacent ledges 20 and the upper surface of face 16. A plurality of ribs 32 extend inwardly from ledges 20 generally between the openings 38. An integral portion of the housing 12 located along the lower face of the housing provides for a terminal seat 34. Each pocket 30 includes a portion extending into this terminal seat 34 so that contact terminals 40 can be positioned within individual pockets 30 with the terminal extending between seat 34 and inner pocket face 36 which comprises the outer portion of each wall 22. Pockets thus extend upwardly form the lower surface of the base 16 to an opening 38 so that each pocket 30 communicates with the cavity 18 formed between ledges 20 and the top surface of the socket base 16.

A plurality of contact terminals 40 edge stamped from a spring metal such as beryllium copper are dimensioned to be received within individual pockets 30. Each contact terminal 40 has an upwardly extending contact nose or projection 42. This projection 42 constitutes the upper extremity of a vertical arm 46. A cam follower 44 extends laterally from an outer edge of arm 46. Arm 46 is joined to a relatively more resilient spring section, which in the preferred embodiment of this invention, comprises a curved section having a width less than the width of the arm 46. The resilient spring section 48 merges at its lower end with the inner portion of a contact base 50. Contact base 50 projects inwardly beyond the inner edge of contact terminal arm 46 and outwardly beyond the outer extremity of the cam follower section 44. Contact base 50 extends generally horizontal. Contact posts 52 extend downwardly from the lower edge of the contact base 50. In the preferred embodiment of this invention, three separate contact base configurations are employed. The only difference between the three different contact terminal configurations is the position the the respective contact post 52. By offsetting or staggering the position of the contact post on adjacent contact terminals 40, closer contact spacing can be achieved on a printed circuit board. Staggering of the contact posts 52 is necessary so that close spacing of the traces on the printed circuit board to which the burn-in socket is attached can be achieved. An outer tab section 54 extends upwardly from the contact base 50. As will become apparent, the horizontally extending contact base with the outer tab 54 provide the means to secure the contact terminals 40 in insulated housing 12 so that the contact terminals can be inserted into the bottom of the insulative housing.

The cap 14 is secured to the insulative housing 12 by latch arms 66 which extend upwardly from the insulative housing 12 through holes 64 located at the corners of the cap 14. Cap 14 comprises a frame member having 4 sidewalls 60 surrounding an opening which is aligned with cavity 18. The holes 64 are located at the corners where adjacent wall 60 intersect. Latch arm 66 has a downwardly facing latching shoulder 58 located near the upper end of latch arms 66. An upwardly facing latching shoulder 68 is located on the interior of each hole 64. The cap 14 can be secured to the insulative housing 12 by inserting the latch arms 66 into hole 64. A bevelled surface at the upper outside edge of each latch arm 66 will cam the latch arm 66 inwardly so that the latch arm can be inserted to a point at which the downwardly facing shoulder 58 will be located above the upwardly facing shoulder 68. The latch arms 66 will be in their outer most position at this point so that the shoulders 58 and 68 act to lock the cap 14 onto the insulative housing 12.

The contact terminals 40 can be inserted into the insulative housing 12 either before or after the cap 14 is secured to the insulative housing. As previously mentioned, the contact terminals 40 are inserted into respective pockets 30 from the bottom of the insulative housing 12. Each pocket 30 has sufficient room to receive the terminal arms 46 and the relatively more resilient portions 48. The contact base and the extension 54 at its outer end fit into grooves facing downwardly in each pocket 30 so that the contact terminal base 50 is wedged into these grooves and the respective terminals 40 are retained within their corresponding pockets 30. The contact nose or projection located at the upward end of the arm 46 projects through the opening 38 at the upward end of packet 30. Each contact projection 42 is aligned between adjacent ribs 32 with the projection 42 being spaced from the interface of the most adjacent ledge 20. Each opening 38 is longer than the width of the projection 42 so that the contact projection 42 may move within an opening 38 when the contact terminal is flexed. The cam follower section 44 extends outwardly and abuts a downwardly facing inclined surface 62 on the inner lower face of the wall 60 of the cap 14. This inclined surface 62 remains in contact with the outer radiused portion of the cam following surface 44 of each contact terminal 40 positioned along each side of the cavity 18. Since the contact terminals 40 are positioned in rows, a single camming surface 62 will engage the camming arms 44 on a plurality of contact terminals. Downward movement of the cap 14 will cause relative movement between the inner inclined camming surface 62 and the terminals 40. This relative movement, transmitted to the terminals through cam following member 44 will cause inward or clockwise deflection of each terminal 40, when viewed from the perspective of FIGS. 7-10.

Insertion of a gullwing PQFP package is depicted in FIGS 7-10. FIG. 7 shows the neutral position of the socket 10 immediately prior to insertion of the gullwing package. The package 4 is shown with the lead 6 generally aligned with a corresponding contact terminal 40 so that the package 4 can be inserted within cavity 18 located at the top of the socket. The package 4 is also positioned so it can be inserted between the outer wall 60 of the cap. FIG. 8 shows that the first step for zero insertion force insertion of package 4 calls for a downward force to be imparted to the cap 14. Camming surface 62 engages cam following member 44 to cause inward deflection of the contact nose or projection 42. Note that contact projection 42 can be deflected inwardly to a sufficient extent to permit the foot portion of gullwing lead 6 to be inserted between ledge 26 and contact projection 42. FIG. 9 shows the PQFP package 2 inserted to a position in which the foot 6A on gullwing lead 6 is located outwardly beyond the inwardly deflected contact projection 42 with the outer end of the foot 6A opposed to and positioned for abutment with the inner surface 26 of ledge 20. Contact foot 6A is positioned such that it is on top of the lower face 28 of the ledge 20. Removal of the downward force on cap 14 permits outward deflection of the contact arm 46 so that the projection 42 engages the inner surface of gullwing lead 6 between the gullwing lead 6 and the body 4 of the PQFP 2. Since the outer end of the gullwing lead 6A abuts inner surface 26 of ledge 20 each gullwing lead 6 will not be overstressed by engagement of th spring actuated contact nose 42. Furthermore, the contact terminal 40 does not engage a surface on the gullwing contact lead 6 which is relied upon to form a good solder joint with a surface mount pad on a printed circuit board.

Extraction of the PQFP package can be accomplished by simply reversing the steps of FIGS. 7-10. Application of a downward force on the cap 14 will again free the gullwing lead 6 from the contact terminals 40 so that the package 2 can be extracted. As shown in FIG. 7-10, this socket configuration can be actuated by linear motion only and the packages 2 can be inserted into the cavity 18 at the top of the socket 2 by linear movement. Thus, this socket can be used with automatic loading and unloading equipment. Furthermore, no adapter must be attached to the PQFP package 2 to prevent damage to the leads. Although the preferred embodiment of this invention is directed to a burn-in socket for use with plastic quad flat pack packages having gullwing leads, it should be understood that this invention is also applicable to any other component which would have fragile gullwing leads of the type used on PQFP packages. Therefore, this invention is not limited to the preferred embodiment depicted herein.

We claim:

1. A socket for establishing electrical interconnection to an electrical component having a plurality of contact leads protruding from the body of the component; comprising an insulative housing, a cap shiftable relative to the insulative housing, and a plurality of contact terminals mounted in the housing, the cap engaging the contact terminals during movement of the cap relative to the insulative housing to shift the terminal from a first to a second position to permit insertion of the electrical component into the socket, each terminal having outwardly facing contact means for engaging a corresponding contact lead on an inner surface of the contact lead adjacent to the component body when the contact terminal is in the first position, movement of the terminal from the first to the second position being accompanied by corresponding movement of said outwardly facing contact means.

2. The socket of claim 1 wherein the contact means comprises a portion of the terminal extending upwardly from a relatively more resilient portion of the terminal.

3. The socket of claim 2 wherein the terminal includes a cam following member between the contact means and the relatively more resilient portion of the terminal.

4. The socket of claim 3 wherein the cam following member of each terminal is engageable with an inclined surface on the cap to shift the terminal from the first to the second position.

5. The socket of claim 1 wherein the housing includes ledge means spaced from the contact means when the terminal is in the second position, the ledge means including a surface positioned to engage the free end of each contact lead when the contact means engages the surface of the contact lead adjcent to the component body so that at least a portion of each contact lead is held etween the ledge means and the contact means.

6. The socket of claim 5 wherein the insulative housing includes a base onto which the electronic component can be positioned, the contact means on each terminal and the ledge means extending above the base.

7. The socket of claim 1 wherein the cap is held on the insulative housing by engagement between oppositely facing shoulders on a latch arm and in a hole into which the latch arm is received.

8. The socket of claim 7 wherein the latch arm is on the insulative housing and the hole extends at least partially through the cap.

9. The socket of claim 8 wherein the cap is shiftable toward the housing to shift the terminals from the first to the second position, the terminals being spring biased to urge the cap away from the housing when the terminals are in engagement with the contact leads.

10. A socket for establishing electrical connection with an integrated circuit package having a plurality of contact leads extending outwardly from a package body, comprising: an insulative housing, a cap shiftable relative to the insulative housing, and a plurality of contact terminals positioned in the insulative housing, the cap engaging the contact terminals during movement of the cap relative to the insulative housing to shift the terminal from a first to a second position to permit insertion of the integrated circuit package into the socket, each terminal being shiftable toward the package body to permit zero force insertion of the integrated circuit package leads and being outwardly spring biased to engage the leads.

11. The socket of claim 10 wherein the cap is shiftable toward the housing to shift the terminals from the first to the second position, the spring biased terminals urging the cap away from the housing.

12. The socket of claim 10 wherein the integrated circuit package contact leads comprise gullwing leads, and the contact terminals include a protruding portion for engaging an inner surface of the gullwing leads.

13. The socket of claim 12 wherein the insulative housing has a base with a ledge extending around at least a portion of the base.

14. The socket of claim 13 wherein the ledge is juxtaposed to the protruding portion of the terminal so that at least a portion of each gullwing lead is held between the ledge and a corresponding contact terminal.

15. The socket of claim 14 wherein the protruding portion of each contact terminal extends through a corresponding opening between the ledge and the base of the housing.

16. The socket of claim 15 wherein the insulative housing includes a pocket for each contact terminal extending upwardly from the bottom of the insulative housing to the opening between the ledge and the base of the housing each terminal being insertable into the insulative housing from below.

17. The socket of claim 16 wherein the cap is disposed around the ledge for telescoping movement relative to the insulative housing.

18. The socket of claim 17 wherein contact terminals are disposed along four sides of a cavity formed by the ledges on the top of the insulative housing, the cap comprising a frame having an open center through which the integrated circuit package can be inserted to position the integrated circuit package in the cavity on top of the insulative housing.

19. The socket of claim 10 wherein each contact terminal comprises an edge stamped terminal oriented with the plane of the terminal extending orthogonally relative to a side surface of the insulative housing.

20. A socket for establishing electrical interconnecton to an electrical component having a plurality of gullwing contact leads protruding from the body of the component, each gullwing contact lead having a laterally extending foot at the free end thereof comprising: an insulative housing having an inwardly facing ledge; a plurality of contact terminals shiftable away from the ledge, the contact terminals being resiliently biased toward the ledge; and means for shifting the contact terminals away from the inwardly facing ledge a sufficient distance to permit insertion of the laterally extending feet of the gullwing contact leads between the ledge and corresponding contact terminals, the contact terminals resiliently engaging corresponding gullwing contact leads with the inwardly facing ledge forming a stop to prevent deformation of the individual gullwing contact leads.

21. The socket of claim 20 wherein the means for shifting the contact terminals away from the ledge comprises a member shiftable towards and away from the insulative housing in a direction substantially parallel to the ledge.

22. The socket of claim 21 wherein each contact terminal includes a cam section extending outwardly beyond the ledge, the cam section being engageable with the member shiftable towards and away from the insulative housing.

23. The socket of claim 20 wherein each contact terminal includes a protruding portion for engaging each gullwing contact lead between on an inner surface adjacent the body of the component.

24. A burn-in test socket for establishing electrical interconnection to a PQFP electrical component having a plurality of gullwing contact leads protruding from four sides of the PQFP body and spaced apart on centerlines of 0.025 inch, each gullwing contact lead having a laterally extending foot at the free end thereof, the bottom of the gull wing foot being plated to facilitate soldering the lead, the socket comprising: an insulative housing having inwardly facing stationary ledges on four sides of an insulative housing base; a plurality of contact terminals shiftable away from the ledges, the contact terminals being resiliently biased toward the ledges; the frame means, through which the PQFP electrical component can be inserted, for shifting the contact terminals on each of the four sides inwardly away from the inwardly facing ledges a sufficient distance to permit insertion of the laterally extending feet of the gullwing contact leads between the ledges and corresponding contact terminals, the contact terminals resiliently engaging corresponding gullwing contact leads on an inner lead surface above the foot and adjacent the PQFP body, with the inwardly facing ledges forming a stationary stop to prevent outward deformation of the individual gullwing contact leads, and a plurality of ribs extending inwardly from the ledges and spaced apart a sufficient distance to permit insertion of individual PQFP leads between adjacent ribs.

* * * * *